US009036671B2

(12) United States Patent
Takagi

(10) Patent No.: US 9,036,671 B2
(45) Date of Patent: May 19, 2015

(54) METHOD FOR FABRICATING GROUP-III NITRIDE SEMICONDUCTOR LASER DEVICE

(75) Inventor: Shimpei Takagi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 481 days.

(21) Appl. No.: 13/567,268

(22) Filed: Aug. 6, 2012

(65) Prior Publication Data

US 2013/0065336 A1  Mar. 14, 2013
US 2013/0280837 A9  Oct. 24, 2013

(30) Foreign Application Priority Data

Sep. 13, 2011  (JP) ................. P2011-199682

(51) Int. Cl.
*H01S 5/00*  (2006.01)
*H01S 5/02*  (2006.01)
*B82Y 20/00*  (2011.01)
*H01S 5/20*  (2006.01)
*H01S 5/32*  (2006.01)
*H01S 5/343*  (2006.01)

(52) U.S. Cl.
CPC ............ *H01S 5/0202* (2013.01); *H01S 5/2009* (2013.01); *H01S 5/3202* (2013.01); *H01S 5/3213* (2013.01); *H01S 5/34333* (2013.01); *B82Y 20/00* (2013.01)

(58) Field of Classification Search
CPC ................................................ H01S 5/0202
USPC ................. 372/44.01, 45.01; 438/33
See application file for complete search history.

(56) References Cited

FOREIGN PATENT DOCUMENTS

| JP | 2001-230497 | 8/2001 |
| JP | 2009-081336 | 4/2009 |
| JP | 4475357 | 3/2010 |
| JP | 2011-003660 | 1/2011 |
| JP | 4971508 | 4/2012 |
| WO | WO-2011/077852 A1 | 6/2011 |
| WO | WO-2011/077856 A1 | 6/2011 |

OTHER PUBLICATIONS

International Preliminary Report on Patentability and Written Opinion in PCT International Application No. PCT/JP2012/068623, dated Mar. 27, 2014.
Magi et al., "Semipolar (10-1-1) InGaN/GaN Laser Diodes on Bulk GaN Substrates," Japanese Journal of Applied Physics, vol. 46, No. 19, pp. L444-L445 (2007).

*Primary Examiner* — David Vu
(74) *Attorney, Agent, or Firm* — Venable LLP; Michael A. Sartori

(57) ABSTRACT

A method for fabricating a group-III nitride semiconductor laser device stably supplies laser cavity mirrors having a low lasing threshold current through the use of a semi-polar plane. A blade 5g is forced down through a first region ER1 to keep the first region ER1 squeezed between a support member H2 and a movable member H1 together with a part of a protective sheet TF in contact with the first region ER1 while the tension generated in the area of the protective sheet TF in contact with the first region ER1 with the movable member H1 increases until the semi-polar principal surface SF at an end face EG1 of the first region ER1 tilts by a deflection angle THETA from the semi-polar principal surface SF of a second region ER2, and a force is thereby generated in the first region ER1 in a direction opposite to the direction of travel of the blade 5g toward the first region ER1. For example, an angle ALPHA is within the range of 71 degrees to 79 degrees, and the deflection angle THETA is within the range of 11 to 19.

19 Claims, 9 Drawing Sheets

Fig.3
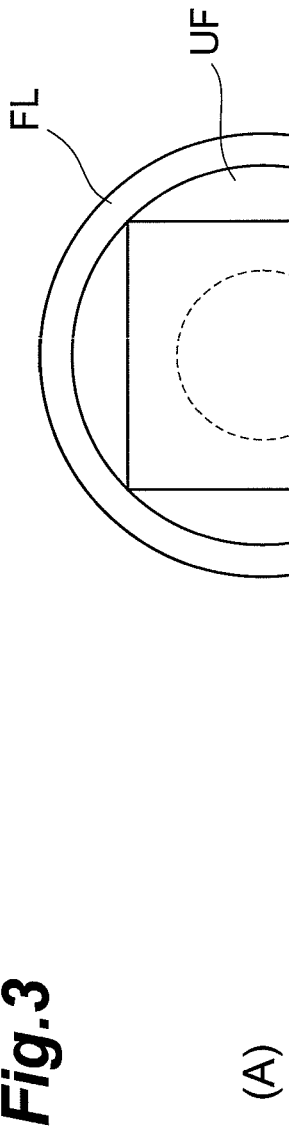
(A)
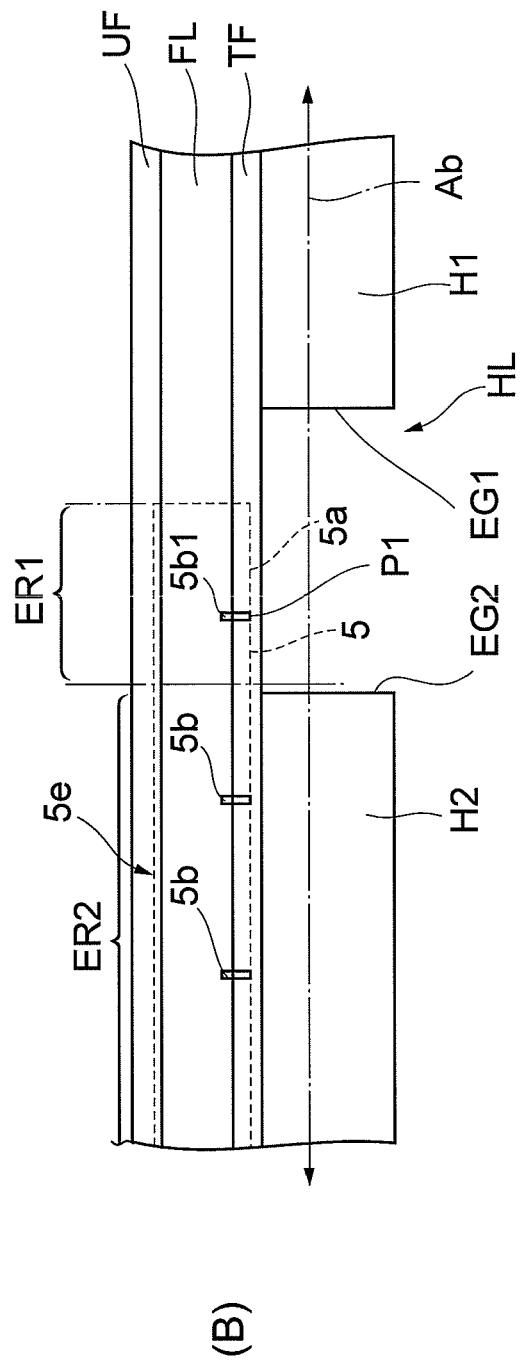
(B)

*Fig.4*
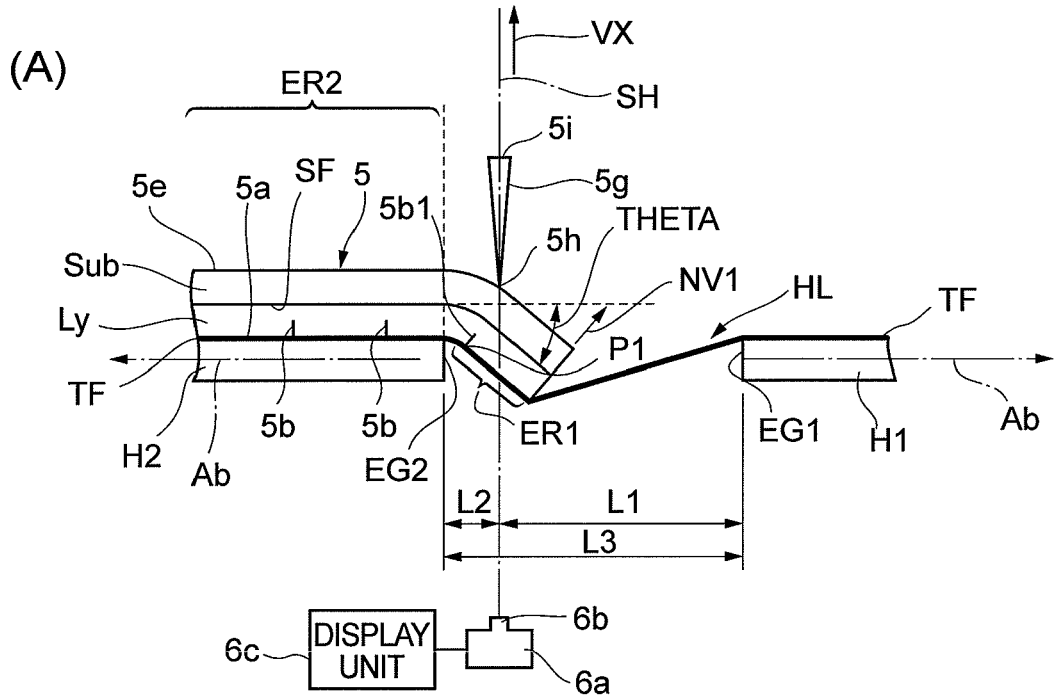
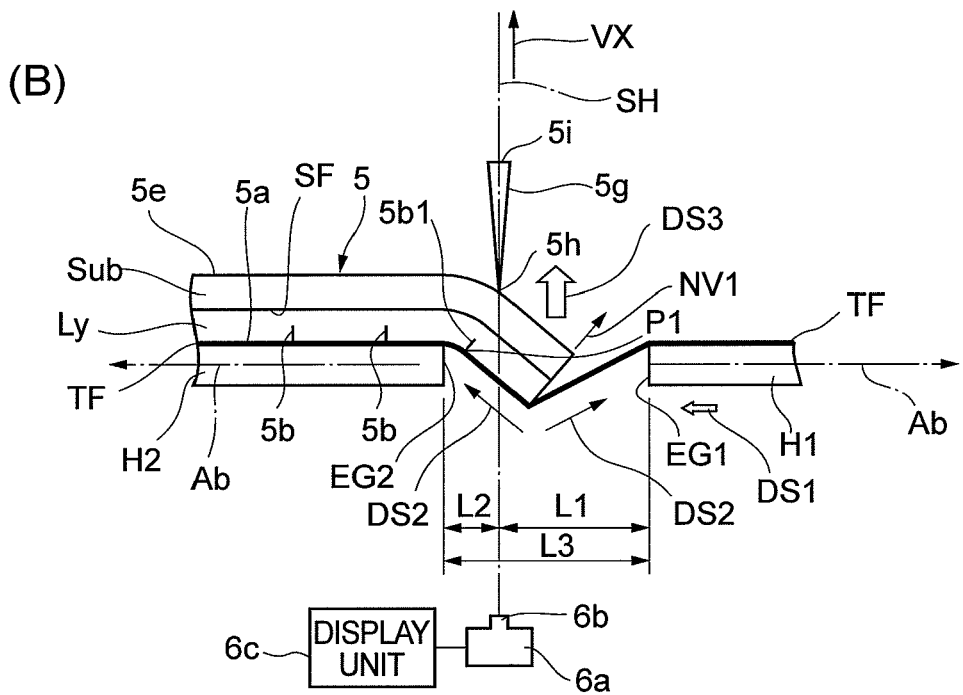

Fig.6
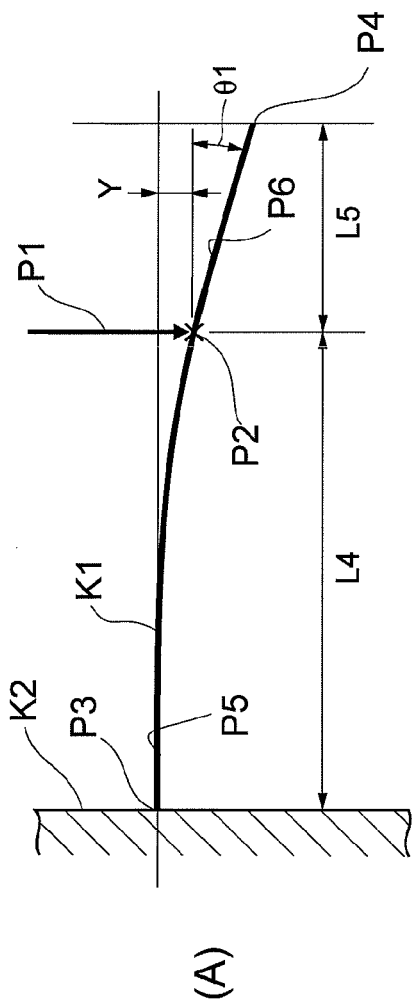
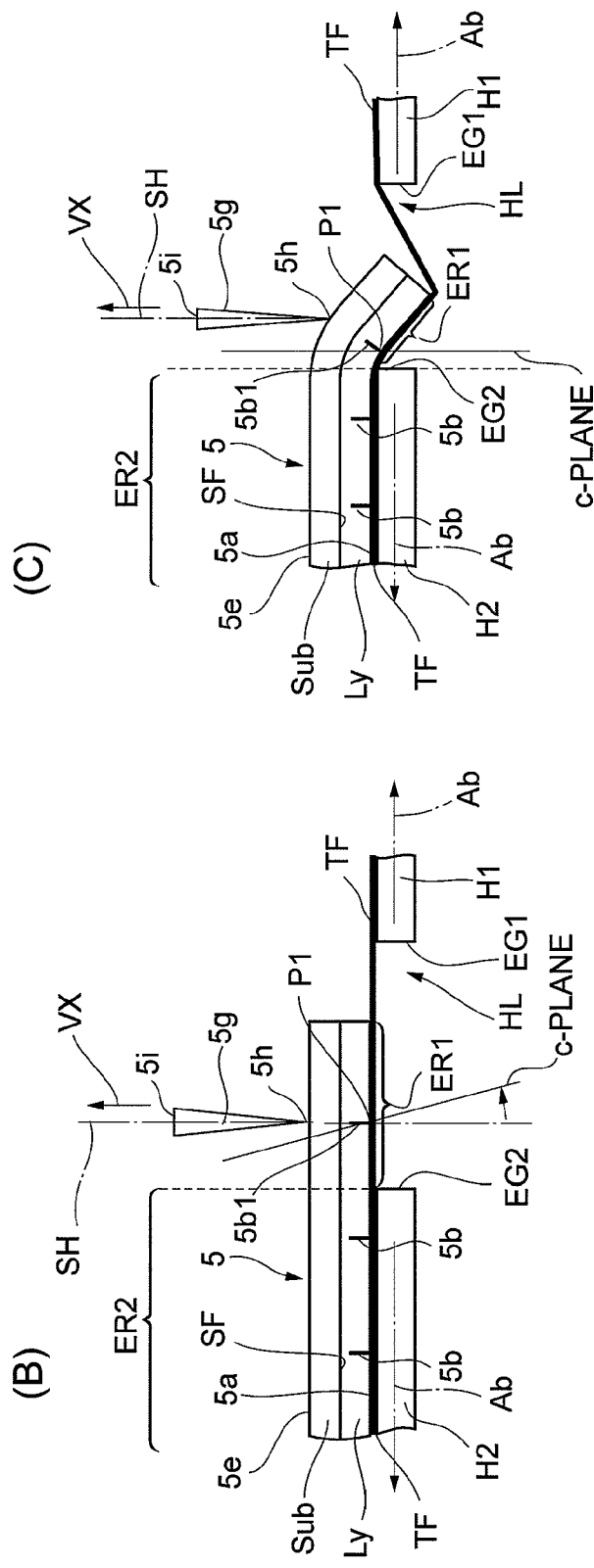

METHOD FOR FABRICATING GROUP-III NITRIDE SEMICONDUCTOR LASER DEVICE

BACKGROUND OF THE INVENTION

1. Field of the Invention

The present invention relates to a method for fabricating a group-III nitride semiconductor laser device.

2. Related Background Art

Patent Literature 1 (Japanese Unexamined Patent Application Publication No. 2011-3660) discloses technology associated with a group-III nitride semiconductor laser device that has a low threshold current on the semi-polar plane of the support base including a hexagonal group-III nitride semiconductor whose c-axis tilts toward the m-axis. First and second fractured faces, which constitute a laser cavity, intersect the m-n plane. The group-III nitride semiconductor laser device has a laser waveguide extending in a direction of an intersecting line between the m-n plane and a semi-polar plane. Thus, light can be generated by interband transition that has a low threshold current. The first surface opposes the second surface in the laser structure. The first and second fractured faces extend from the edge of the first surface to the edge of the second surface. The first and second fractured faces are not produced by dry etching and are different from conventional cleavage planes such as the c-plane, the m-plane, and the a-plane. In association with technology to Patent Literature 1, a technology is known as is disclosed in Non Patent Literature 1 ("Semipolar (10-1-1) InGaN/GaN Laser Diodes on Bulk GaN Substrates", Anurag TYAGI, Hong ZHONG, Roy B. CHUNG Daniel F. FEEZELL, Makoto SAITO, Kenji FUJITO1, James S. SPECK, Steven P. DENBAARS, and Shuji NAKAMURA, Japanese Journal of Applied Physics, Vol. 46, No. 19, 2007. pp. L444-L445).

SUMMARY OF THE INVENTION

As described in Patent Literature 1, the laser waveguide of the group-III nitride semiconductor laser device using a semi-polar plane is formed on a semi-polar plane with off to the m-axis in the c-plane. In such a structure, laser cavity mirrors orthogonal to the laser waveguide cannot be readily produced by a conventional cleaving process, and thus have been produced by a fracturing process. A requirement for laser cavity mirrors formed by fracturing is satisfactory functions as laser cavity mirrors of a laser device. In other words, stable supply of laser cavity mirrors having a low lasing threshold current has been awaited. Accordingly, an object of the present invention, which has been accomplished in light of the circumstances described above, is to provide a method for fabricating a group-III nitride semiconductor laser device that enables stable supply of laser cavity mirrors having a low lasing threshold current through the use of a semi-polar plane.

An aspect of the present invention provides a method for fabricating a group-III nitride semiconductor laser device, comprising the steps of: preparing a substrate product having a substrate and a semiconductor region, the substrate comprising a hexagonal group-III nitride semiconductor and including a semi-polar principal surface, the semiconductor region provided on the semi-polar principal surface and including an active layer; scribing a first surface of the substrate product to form a plurality of scribe marks extending along an a-axis of the hexagonal group-III nitride semiconductor; and forming a laser bar and a substrate product residue from the substrate product with a cleaving system. The cleaving system includes a support member supporting the substrate product, a stretchable protective sheet protecting the first surface of the substrate product facing the support member when the substrate product is supported by the support member, a blade forced down through the substrate product toward the support member from a second surface of the substrate product opposite to the first surface when the substrate product is supported by the support member, and a movable member movable relative to the support member and adjusting the tension of the protective sheet. The protective sheet extends in the direction of a reference axis and is disposed between the substrate product and the support member while both edges of the protective sheet intersecting the reference axis are fixed to the support member. The substrate product is disposed over the protective sheet and the support member such that the a-axis intersects the reference axis, the substrate product comprising a first region and a second region. The first region and the second region are disposed in sequence in a direction intersecting the a-axis. The interface of the first region and the second region extends along the a-axis. The first region includes a scribe mark at the furthest end among the scribe marks. The step of forming the laser bar and the substrate product residue includes the steps of: holding the substrate product with the support member such that the first region protrudes from an edge of the support member and the second region is disposed over the support member; putting the blade into contact with an area included in the first region of the second surface in a direction along a normal vector extending along a normal axis of the semi-polar principal surface of the substrate; and forcing the blade down through the first region such that the first region is squeezed between the support member and the movable member together with a part of the protective sheet in contact with the first region while increasing the tension generated in the area of the protective sheet using the movable member to generate a force in the first region in a direction opposite to the direction of travel of the blade toward the first region, until the semi-polar principal surface at an end face of the first region tilts by a deflection angle THETA from the semi-polar principal surface of the second region. The laser bar extends from the first surface to the second surface and has a first end surface and a second end surface formed by separation. The first end surface and the second end surface constitute a laser cavity of the group-III nitride semiconductor laser device. A c-axis vector representing the direction of a c-axis of the hexagonal group-III nitride semiconductor tilts by an angle ALPHA from a normal vector of the semi-polar principal surface of the substrate. An area in the first region in contact with the blade extends along the a-axis. The deflection angle THETA is defined in the c-m plane, the c-m plane being defined by the c-axis and an m-axis of the hexagonal group-III nitride semiconductor, the deflection angle THETA having a positive value when the substrate product bends in the direction from the m-axis to the c-axis, having a negative value when the substrate product bends in the direction from the c-axis to the m-axis, being within a range of 11 degrees to 19 degrees if the angle ALPHA is within a range of 71 degrees to 79 degrees, and being within a range of −19 degrees to −11 degrees if the angle ALPHA is within a range of 101 degrees to 109 degrees. The first end surface and the second end surface intersect the c-m plane.

In this method, the blade is forced down through the first region to keep the first region squeezed between the support member and the movable member together with a part of the protective sheet in contact with the first region until the semi-polar principal surface at an end face of the first region tilts by a deflection angle THETA from the semi-polar principal surface in the second region and, at the same time, the tension generated in the area of the protective sheet in contact with the first region is increased using the movable member to generate a force in the first region in a direction opposite to the direction of travel of the blade toward the first region. If the angle ALPHA is within the range of 71 degrees to 79 degrees, the substrate product bends in the direction from the m-axis to the c-axis, and the deflection angle THETA is within the range of 11 degrees to 19 degrees or if the angle ALPHA is within the range of 101 degrees to 109 degrees, the substrate product bends in the direction from the c-axis to the m-axis, and the deflection angle THETA is within the range of −19 degrees to −11 degrees, the blade is forced down through the first region of the substrate product in the direction along the c-plane due to the bending of the substrate product. In such a state, the laser bar can be easily separated from the substrate product with a semi-polar principal surface by increasing the tension of the protective sheet and generating a force in the first region in a direction opposite to the direction in which the blade is forced down through the first region. The surface formed as a result of the separation has sufficient flatness and perpendicularity to serve as a laser cavity mirror. This enables stable supply of laser cavity mirrors that reduce the lasing threshold current.

In the method, the scribe marks extend in a direction from the first surface to the second surface along an a-n plane defined by the a-axis and the normal axis. Since the scribe marks are formed along the a-n plane, the end faces formed by the separation of the laser bar by the blade also extends along the a-n plane. Thus, the end surfaces that are to be used as laser cavity mirrors are orthogonal to the c-m plane.

In the method, it is preferable that, in the step for preparing the substrate product, the substrate is subject to a process so as to have a thickness ranging from 50 μm to 100 μm. The process is one of slicing and grinding. The second surface is one of a processed surface formed by the process and a surface including an electrode disposed on the processed surface. Thus, the substrate has high rigidity. The processed surface of the substrate processed by slicing or polishing has sufficiently high flatness.

In the method, the scribing is conducted with a laser scriber. The scribe marks include scribe grooves. Scribing with a laser scriber enables precise scribe marks to be formed. Since a scribe mark includes a scribe groove, the laser bar can be readily separated.

In the method, the semi-polar principal surface tilts within a range of −4 degrees to +4 degrees toward an m-plane from a semi-polar plane corresponding to any one of {20-21} and {20-2-1} planes. Thus, the method can be applied to a substrate product having a semi-polar plane tilting within a range of −4 degrees to +4 degrees toward the m-plane from any one of {20-21} and {20-2-1} planes.

In the method, the semi-polar principal surface corresponds to any one of {20-21} and {20-2-1} planes. Thus, the method can be applied to a substrate product having a semi-polar plane corresponding to any one of {20-21} and {20-2-1} planes.

In the method, the substrate includes any one of GaN, AlGaN, InGaN, and InAlGaN. In this way, a nitride-based semiconductor is used as the substrate.

In the method, end faces of the active layer in the first end surface and the second end surface tilt by an angle within a range of (ALPHA−5) degrees to (ALPHA+5) degrees in the c-m plane from an m-plane orthogonal to the m-axis. Thus, the first and second end surfaces achieve high flatness and perpendicularity required for laser cavity mirrors.

In the method, end faces of the active layer tilt by an off angle within a range of −5 degrees to +5 degrees in a reference plane orthogonal to the c-m plane and the normal axis from a plane orthogonal to an intersecting line between the c-m plane and the reference plane. Thus, an end face of the active layer can achieve high flatness and perpendicularity required for a laser cavity mirror.

BRIEF DESCRIPTION OF THE DRAWINGS

FIG. 3 illustrates a substrate product according to an embodiment being supported by a support plate.

FIG. 4 illustrates a cleaving system and the method of fracturing a substrate product used in the method for fabricating a group-III nitride semiconductor laser device according to an embodiment.

FIG. 6 illustrates the function of the method fracturing a substrate product used in the method for fabricating a group-III nitride semiconductor laser device according to an embodiment.

DESCRIPTION OF THE PREFERRED EMBODIMENTS

Figure 1:
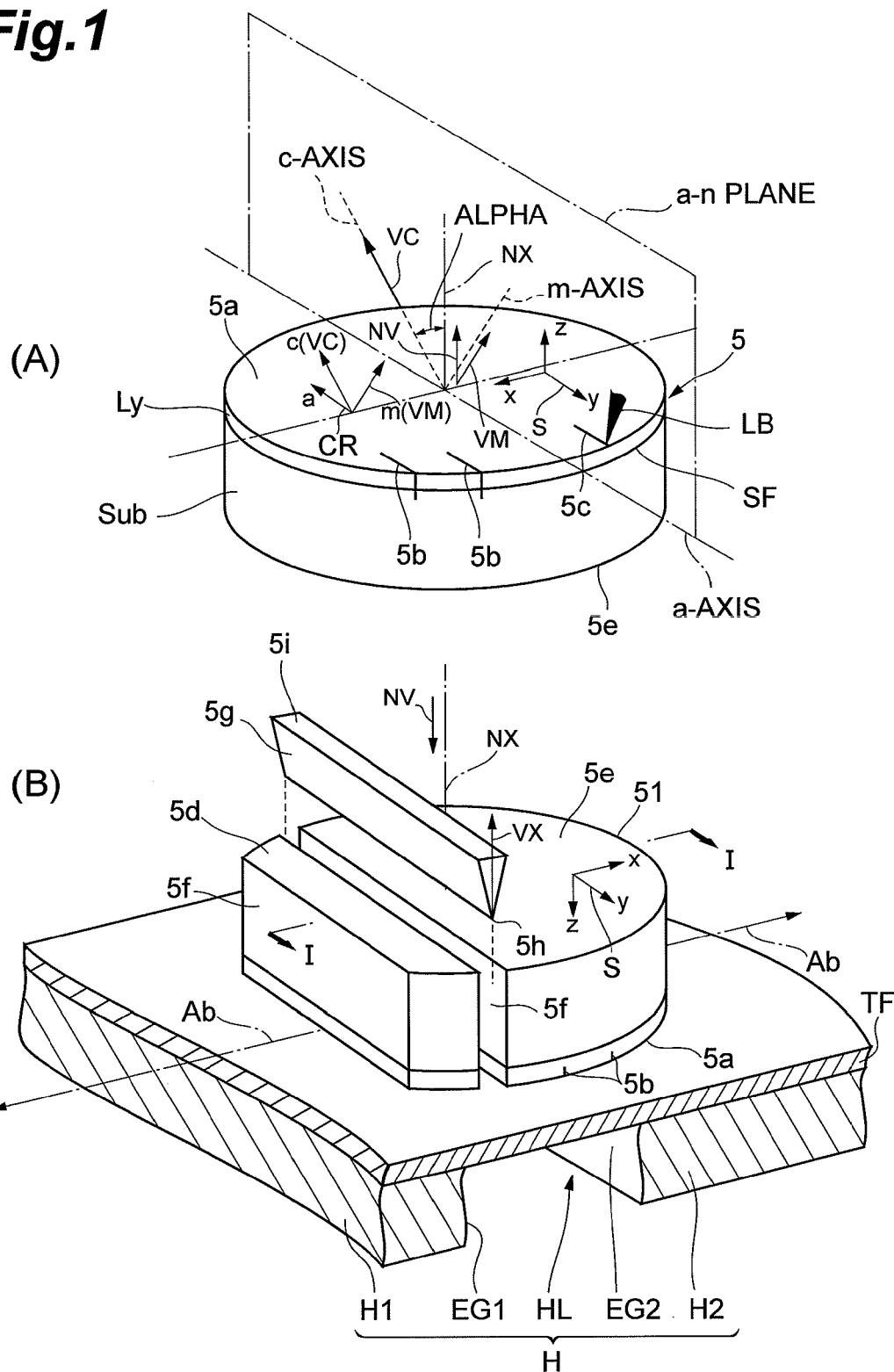
FIG. 1 illustrates a method fracturing a substrate product used in a method for fabricating a group-III nitride semiconductor laser device according to an embodiment.
Figure 2:
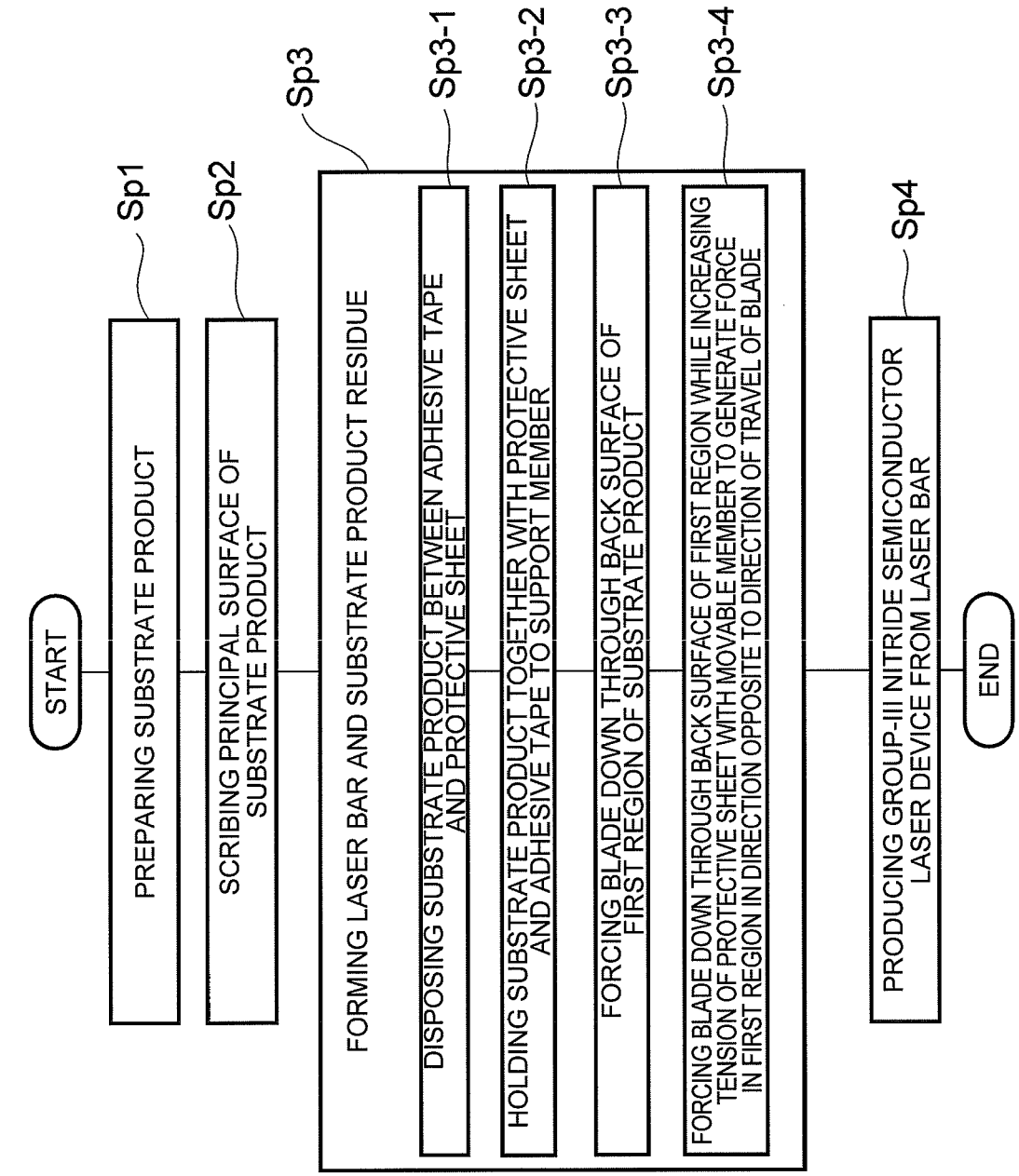
FIG. 2 is a flow chart illustrating essential steps of the method for fabricating a group-III nitride semiconductor laser device according to an embodiment.

Embodiments of the present invention will now be described in detail with reference to the accompanying drawings. The same elements will be designated by the same reference numerals, when appropriate, and the duplicate descriptions thereof will be omitted. The method according to this embodiment is a method for fabricating a group-III nitride semiconductor laser device. FIG. 2 illustrates essential steps in the method for fabricating a group-III nitride semiconductor laser device according to this embodiment. FIG. 1 illustrates a substrate product and a laser bar used in fabrication of a group-III nitride semiconductor laser device.

Step Sp 1: A substrate product 5, which is illustrated in Part (A) of FIG. 1, is prepared. The substrate product 5 includes a laser structure of a hexagonal group-III nitride semiconductor provided with a p-side insulating film, a p-side electrode, and an n-side electrode. The "p-side" corresponds to a side to which a p-type semiconductor region is aligned in the laser structure of the substrate product 5 of a hexagonal group-III nitride semiconductor. The "n-side" corresponds to a side to which an n-type semiconductor region is aligned in the laser structure of the substrate product 5 of a hexagonal group-III nitride semiconductor.

Figure 7:
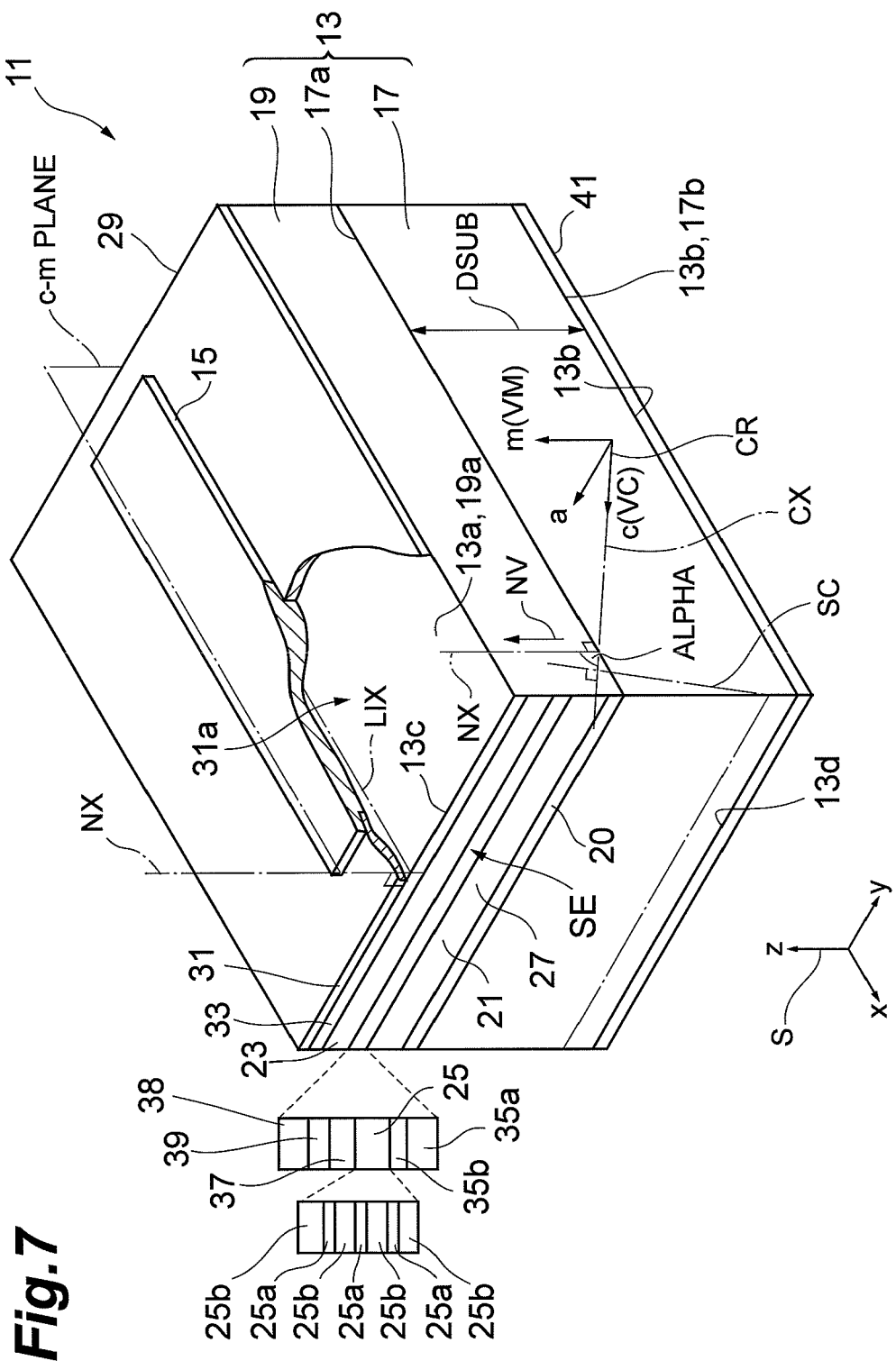
FIG. 7 illustrates a group-III nitride semiconductor laser device fabricated through the method for fabricating a group-III nitride semiconductor laser device according to an embodiment.

A group-III nitride semiconductor laser device 11, which is illustrated in FIG. 7, is separated from the substrate product 5.

The laser structure of the hexagonal group-III nitride semiconductor of the substrate product 5 is a wafer including a substrate Sub (corresponding to a support base 17 of the group-III nitride semiconductor laser device 11) and a semiconductor region Ly (corresponding to a semiconductor region 19 in the group-III nitride semiconductor laser device 11).

The substrate Sub includes any one of GaN, AlGaN, AlN, InGaN, and InAlGaN. The substrate Sub includes a semipolar principal surface SF (corresponding to a semi-polar principal surface 17a of the group-III nitride semiconductor laser device 11) of the hexagonal group-III nitride semiconductor.

The semi-polar principal surface SF tilts within a range of −4 degrees to +4 degrees from a semi-polar plane corresponding to any one of {20-21} and {20-2-1} planes toward the m-plane of the hexagonal group-III nitride semiconductor of the substrate Sub. The semi-polar principal surface SF may correspond to any one of {20-21} and {20-2-1} planes.

The semiconductor region Ly is epitaxially grown over the semi-polar principal surface SF of the substrate Sub and is in contact with the semi-polar principal surface SF.

The substrate product 5 includes a p-side insulating film (corresponding to an insulating film 31 of the group-III nitride semiconductor laser device 11), a p-side electrode (corresponding to a p-side electrode 15 of the group-III nitride semiconductor laser device 11), and an n-side electrode (corresponding to an n-side electrode 41 of the group-III nitride semiconductor laser device 11). The p-side electrode is disposed over the p-side front face 5a (first surface and a p-side front face of the insulating film) of the substrate product 5. The n-side electrode covers the front face of the substrate Sub. The front face of the n-side electrode is the back face 5e (second surface) of the substrate product 5.

The substrate Sub is processed into a thickness of 50 μm or more and 100 μm or less. The substrate is processed through one of slicing and grinding. The back face 5e of the substrate product 5 is either the processed surface or a surface including the n-side electrode disposed on the processed surface.

The normal axis NX is a normal line of the semi-polar principal surface SF and is orthogonal to the front face 5a of the substrate product 5. The normal vector NV extends in the direction of the normal axis NX of the semi-polar principal surface SF of the substrate Sub and extends along the normal axis NX from the semi-polar principal surface SF toward the semiconductor region Ly. The normal vector NV is orthogonal to the front face 5a and the semi-polar principal surface SF. The normal axis NX and the normal vector NV are parallel to the z-axis of the orthogonal coordinate system S. The normal vector NV extends in the z direction. The front face 5a and the semi-polar principal surface SF are parallel to an x-y plane.

Part (A) of FIG. 1 illustrates a crystal coordinate system CR. A c-axis vector VC indicating the direction of the c-axis of the hexagonal group-III nitride semiconductor of the substrate Sub has a tilt angle ALPHA from the normal vector NV of the semi-polar principal surface SF. The angle ALPHA is either within the range of 71 degrees to 79 degrees or within the range of 101 degrees to 109 degrees. The angle ALPHA exemplified in Part (A) of FIG. 1 is within the range of 71 degrees to 79 degrees. The a-axis of the hexagonal group-III nitride semiconductor of the substrate Sub extends in a direction opposite to the y-axis. The c-axis of the hexagonal group-III nitride semiconductor of the substrate Sub, the c-axis vector VC indicating the direction of the c-axis, the m-axis of the hexagonal group-III nitride semiconductor of the substrate Sub, an m-axis vector VM indicating the direction of the m-axis, the normal axis NX, and the normal vector NV indicating the direction of the normal axis NX may be orthogonal to the y-axis (a-axis) and extend in the z-x plane.

Step Sp2: After Step Sp1, the front face 5a is scribed. Such scribing is conducted with a laser scriber. The scribe marks 5b are formed by scribing. The scribe marks 5b extend from the front face 5a of the substrate product 5 to the back face 5e of the substrate product 5 along the a-n plane defined by the a-axis and the normal axis NX. The scribe marks 5b extend in directions parallel to the a-axis from the front face 5a to the semiconductor region Ly. The scribe marks 5b may be, for example, formed at an edge of the substrate product 5. The scribe marks 5b each include a scribe groove. The scribe marks 5b are formed on the front face 5a as a result of laser beam LB irradiation. Part (A) of FIG. 1 illustrates two scribe marks 5b that are already formed, and a scribe mark 5c that is being formed by the laser beam LB. The length of the scribe marks 5b is smaller than the intersecting line between the a-n plane and the front face 5a. Part of the intersecting line is irradiated with the laser beam LB.

Step Sp3: After Step Sp2, the substrate product 5 is fractured into a laser bar 5d and a substrate product residue 51. Step Sp3 includes Steps Sp3-1 to Sp3-5.

The substrate product 5 is fractured with a cleaving system. As illustrated in Part (B) of FIG. 1 and FIGS. 3, 4, a cleaving system includes a support plate H, a blade 5g, a monitor camera 6a, a display unit 6c, a protective sheet TF, an adhesive tape UF, and a tape frame FL. The monitor camera 6a includes a lens 6b. FIG. 4 illustrates the cross-sectional configuration along line I-I in Part (B) of FIG. 1. Part (B) of FIG. 1 illustrates the laser bar 5d after separation, whereas FIG. 4 illustrates the laser bar 5d before separation. For simplification, Part (B) of FIG. 1, and FIG. 4 do not depict the adhesive tape UF and the tape frame FL, which are depicted in FIG. 3.

The support plate H includes a movable member H1 and a support member H2. The movable member H1 and the support member H2 define a gap HL. The end face EG1 of the movable member H1 and the end face EG2 of the support member H2 define the gap HL. The end face EG1 is parallel to the end face EG2.

The support member H2 is fixed (for example, to the inside of a room) to hold the substrate product 5. The movable member H1 can move relative to the support member H2 to adjust the tension of the protective sheet TF. The shifting of the movable member H1 varies the width of the gap HL (the distance between the end face EG1 and the end face EG2) between the end face EG1 and the end face EG2, which are disposed parallel to each other. The surface of the movable member H1 and the surface of the support member H2 define the surface of the support plate H on which the substrate product 5, the protective sheet TF, and the adhesive tape UF are placed. Even if the movable member H1 shifts relative to the support member H2, the surface of the movable member H1 and the surface of the support member H2 are in a single plane (in the surface of the support plate H).

The blade 5g is disposed above the gap HL and can move perpendicularly to the surface of the support member H2 on which the substrate product 5 is to be placed. The blade 5g can move either toward or away from the gap HL.

The protective sheet TF is stretchable and protects the front face 5a of the substrate product 5, which faces the support member H2, while the substrate product 5 is supported by the support member H2. The protective sheet TF extends in the direction of a reference axis, specifically the x-axis, orthogonal to the a-n plane. The two ends of the protective sheet TF intersecting the reference axis are fixed (to, for example, the inside of the room and the support member H2) and are disposed between the substrate product 5 and the support member H2. The protective sheet TF may be, for example, a PET film having a thickness of approximately 25 μm. If the substrate product 5 is supported by the support member H2 such that the front face 5a faces the support member H2, the blade 5g is forced down through the substrate product 5 toward the support member H2 from the back face 5e of the substrate product 5. The back face 5e faces the opposite side to the front face 5a.

As illustrated in FIG. 4, the blade 5g and the monitor camera 6a are disposed on opposite sides of the gap HL. The axial direction vector VX extending in the direction of the center axis of the blade 5g is parallel to the line connecting the lens 6b of the monitor camera 6a and the edge 5h of the blade 5g. The axial direction vector VX extends in the direction from the edge 5h to the end face 5i of the blade 5g, and is orthogonal to the edge 5h and the end face 5i. The edge 5h extends in one direction (in FIGS. 1, 3, 4, the edge 5h extends in the y-axis direction, which is a-axis direction of the substrate product 5). The edge 5h faces the back face 5e of the substrate product 5. The blade 5g is forced down through the back face 5e of the substrate product 5.

The monitor camera 6a is connected to the display unit 6c. The display unit 6c has a display that displays images acquired by the monitor camera 6a through the lens 6b. The blade 5g and the monitor camera 6a are fixed (to, for example, the inside of the room and the support member H2). If the substrate product 5 is not placed on the support member H2 (if the substrate product 5 is not disposed over the gap HL), the edge 5h of the blade 5g captured through the gap HL is constantly displayed in the center of the display of the display unit 6c. An operator of the support plate H observes the display of the display unit 6c and adjusts the position of the substrate product 5 placed on the support member H2 such that the intersection P1 between the front face 5a and one of the scribe marks 5b is displayed at a position on the display where the edge 5h should be displayed.

Step Sp3-1: The back face 5e of the substrate product 5 is disposed so as to face the adhesive tape UF, and as illustrated in Part (A) of FIG. 3, the substrate product 5 is attached to the adhesive tape UF. The substrate product 5 is disposed between the adhesive tape UF and the protective sheet TF. The edge section of the adhesive tape UF is fixed to the tape frame FL. The fixed tape frame FL (to, for example, the inside of the room and the support member H2) causes the adhesive tape UF to also be fixed (to, for example, the inside of the room and the support member H2). As illustrated in Part (A) of FIG. 3, the front face 5a of the substrate product 5 is covered by the protective sheet TF.

The edge section of the protective sheet TF is attached to the adhesive tape UF and is fixed to the tape frame FL. The fixed tape frame FL (to, for example, the inside of the room and the support member H2) causes the adhesive tape UF and the protective sheet TF to be fixed (to, for example, the inside of the room and the support member H2). The adhesive tape UF and the protective sheet TF include a stretchable material. The substrate product 5 is disposed between the adhesive tape UF and the protective sheet TF. The substrate product 5 is bonded to the adhesive tape UF and the protective sheet TF.

Step Sp3-2: After Step Sp3-1, as illustrated in Part (B) of FIG. 1 and Part (B) of FIG. 3, the substrate product 5, the tape frame FL, the adhesive tape UF, and the protective sheet TF are disposed on the support member H2 such that the front face 5a of the substrate product 5 faces the support member H2. The substrate product 5 is disposed over the protective sheet TF and the support member H2 such that the a-axis intersects the reference axis Ab. The reference axis Ab is orthogonal to the end face EG1 and the end face EG2. The tape frame FL is fixed (to, for example, the inside of the room and the support member H2). The substrate product 5 is placed over the support member H2 such that only the scribe mark at the furthest end among the scribe marks 5b (this scribe mark is referred to as "scribe mark 5b1") formed in the substrate product 5 is positioned above the gap HL. All of the scribe marks 5b formed in the substrate product 5, other than the scribe mark 5b1, are positioned over the support member H2.

The substrate product 5 includes a first region ER1 and a second region ER2. The first region ER1 and the second region ER2 are imaginary regions defined for explanatory purposes. The first region ER1 and the second region ER2 are aligned along a line intersecting the a-axis (y-axis). The first region ER1 is in contact with the second region ER2. The first region ER1 includes the scribe mark 5b1 and does not include the other scribe marks 5b of the substrate product 5. The second region ER2 includes all of the scribe marks 5b formed in the substrate product 5, except for the scribe mark 5b1. The first region ER1 extends together with the scribe mark 5b1 in the a-axis direction (y-axis direction) of the hexagonal group-III nitride semiconductor of the substrate product 5. The interface of the first region ER1 and the second region ER2 extend along the a-axis. The interface of the first region ER1 and the second region ER2 and the scribe mark 5b1 are parallel to the a-axis (and the a-n plane), and are orthogonal to a c-m plane defined by the c-axis and the m-axis.

The support member H2 supports the second region ER2 but not the first region ER1. The entire first region ER1 is positioned above the gap HL. The movable member H1 supports the protective sheet TF and the adhesive tape UF but not the substrate product 5. The substrate product 5 does not overlap the movable member H1. The protective sheet TF is in tight contact with the movable member H1 and the support member H2.

The first region ER1 protrudes from the edge section (end face EG2) of the support member H2 over the gap HL, and the substrate product 5 is held by the support member H2 such that the second region ER2 is disposed above the support member H2. The entire second region ER2 is supported only by the support member H2, and the entire first region ER1 is disposed above the gap HL.

After at least one laser bar 5d is separated from the substrate product 5, the substrate product residue 51 remains. The descriptions on the scribe mark 5b1, the first region ER1, and the second region ER2 are also applicable to the remaining substrate product residue 51.

The tape frame FL is fixed (to, for example, the inside of the room and the support member H2). Thus, the substrate product 5, the edge section of the adhesive tape UF, and the edge section of the protective sheet TF are also fixed (to, for example, the inside of the room and the support member H2). As described above, the movable member H1 is movable relative to the support member H2, and the movement of the movable member H1 varies the width of the gap HL (the distance between the end face EG1 and the end face EG2). The movable member H1 can move along the front face 5a of the substrate product 5 in a direction that varies the width of the gap HL.

Step Sp3-3: After Step Sp3-2, the blade 5g is forced down through the first region ER1 in the back face 5e in the direction of the normal vector NV of the semi-polar principal surface SF of the substrate Sub.

Step Sp3-4: After Step Sp3-3, as illustrated in Part (A) of FIG. 4, the edge 5h of the blade 5g is forced down through the first region ER1 in the back face 5e to move the blade 5g in a direction opposite to the axial direction vector \TX and to be forced down through the first region ER1 into the gap HL. In such a case, the substrate product 5 bends at the interface of the first region ER1 and the second region ER2, and the first region ER1 is squeezed into the gap HL by the blade 5g. In this way, the distance L1 between the plane SH, which passes through the center of the blade 5g, and the end face EG1 is, for example, approximately 2000 µm, and the distance L2 between the plane SH and the end face EG2 is, for example, approximately 375 µm. The distance L3 between the end face EG1 and the end face EG2 equals the sum of the distances L1 and L2. The plane SH is parallel to the end face EG1 and the end face EG2 and extends along the axial direction vector VX. The plane SH is orthogonal to the reference axis Ab.

As a result of the first region ER1 being squeezed into the gap HL by the blade 5g, the semi-polar principal surface SF of the substrate product 5 on the support member H2 bends by a deflection angle THETA. The deflection angle THETA is defined by the plane including the semi-polar principal surface SF in the second region ER2 and the plane including the semi-polar principal surface SF at the end face of the first region ER1. The deflection angle THETA is defined in the c-m plane, which is defined by the c-axis and m-axis. The deflection angle THETA has a positive value when the substrate product 5 bends in the direction from the m-axis to the c-axis and has a negative value when the substrate product 5 bends in the direction from the c-axis to the m-axis. The deflection angle THETA equals the angle defined by the axial direction vector VX and the normal vector NV1. The normal vector NV1 is an inverse vector of the normal vector NV in the end face of the first region ER1. The direction of the normal vector NV in the second region ER2 is the same as that of the axial direction vector VX. However, as illustrated in FIG. 4, if the first region ER1 is squeezed into the gap HL, the normal vector NV1 in the first region ER1 tilts by the deflection angle THETA from the inverse vector of the normal vector NV in the second region ER2 and the axial direction vector VX. The plane defined by the normal vector NV1 and the axial direction vector VX is parallel to the c-m plane and the z-x plane and is orthogonal to the a-axis and the y-axis. If the angle ALPHA is within the range of 71 degrees to 79 degrees and the substrate product 5 bends in a direction from the m-axis to the c-axis, the deflection angle THETA is within the range of 11 degrees to 19 degrees. If the angle ALPHA is within the range of 101 degrees to 109 degrees and the substrate product 5 bends in a direction from the c-axis to the m-axis, the deflection angle THETA is within the range of −19 degrees to −11 degrees.

With the substrate product 5 bent by the deflection angle THETA, the blade 5g is fixed. Then, as illustrated in Part (B) of FIG. 4, the movable member H1 is shifted toward the support member H2 in a direction DS1. The movable member H1 is shifted toward the support member H2 until the distance L1 equals, for example, approximately 505 µm. Tension in a direction DS2 is generated in an area of the protective sheet TF positioned above the gap HL. The first region ER1 receives a resilient force in a direction DS3 (a direction of the axial direction vector VX and a direction in which the first region ER1 moves away from the gap HL) that is forced down through the first region ER1 upward from the gap HL. The blade 5g is forced down through the back face 5e in a direction opposite to the axial direction vector VX. The substrate product 5 is fractured as a result of forcing the blade 5g down through the first region ER1 toward the gap HL in a direction opposite to the axial direction vector VX while the axial direction vector VX of the blade 5g tilts by the deflection angle THETA from the normal vector NV1 of the first region ER1 and receiving a force from the protective sheet TF in the direction of the axial direction vector VX (direction DS3).

In this way, the blade 5g is forced down through the first region ER1 to keep the first region ER1 squeezed into the gap HL together with a part of the protective sheet TF in contact with the first region ER1 until the semi-polar principal surface SF at the end face of the first region ER1 tilts by the deflection angle THETA from the semi-polar principal surface SF of the second region ER2. In this state, the tension generated in the area of the protective sheet TF in contact with the first region ER1 increases using the movable member H1 to generate a force in the first region ER1 in a direction opposite to the direction of travel of the blade 5g. This force causes the laser bar 5d to separate from the substrate product 5 due to fracturing. The end faces 5f (the first and second end surfaces that respectively correspond to a fractured face 27 and a fractured face 29) of the laser bar 5d, which are formed as a result of the fracturing serve as laser cavity mirrors of the semiconductor laser.

The end faces 5f serve as a laser cavity of the group-III nitride semiconductor laser device 11. The laser bar 5d has end faces 5f formed as a result of fracturing. The end faces 5f are different from conventional cleavage planes such the c-plane, the m-plane, and the a-plane. The end faces 5f are formed along the scribe marks 5b. The end faces 5f extend along the a-n plane. The end faces 5f extend from the front face 5a to the back face 5e on the unfractured substrate product 5. The end faces 5f intersect the c-m plane. Such end faces 5f have sufficient perpendicularity and flatness suitable for a laser cavity mirror. The end face (the surface including the end face SE illustrated in FIG. 5) of the active layer of the semiconductor region of the laser bar 5d tilts in the c-m plane by an angle within the range of (ALPHA−5) degrees to (ALPHA+5) degrees from the m-plane orthogonal to the m-axis of the substrate Sub.

Figure 5:
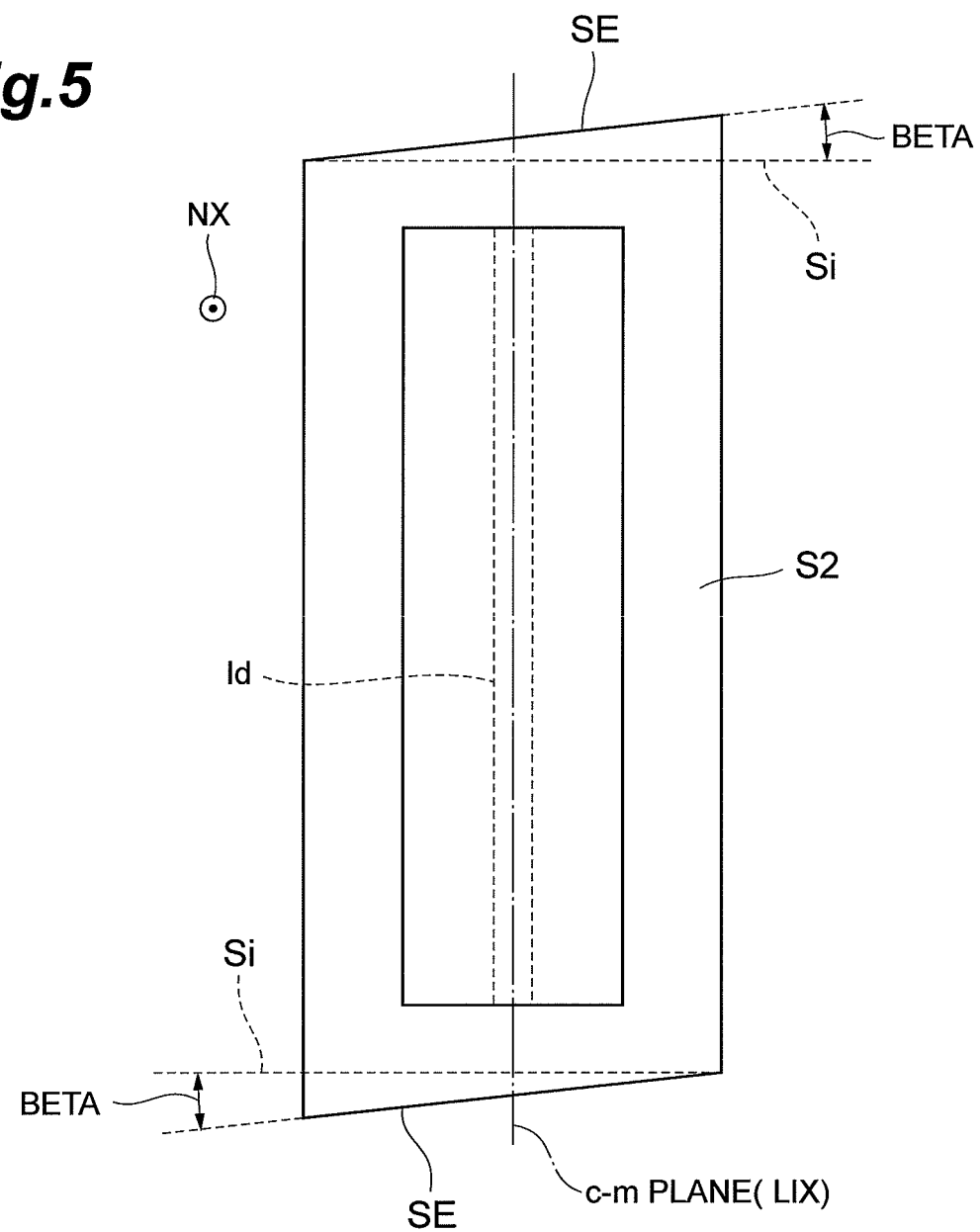
FIG. 5 illustrates the advantageous effect of the method for fabricating a group-III nitride semiconductor laser device according to an embodiment through an off angle of an end face.

The end face (the surface including the end face SE illustrated in FIG. 5) of the active layer of the semiconductor region of the laser bar 5d tilts in a reference plane (the surface including an plane S2 illustrated in FIG. 5) orthogonal to the c-m plane and the normal axis NX by an off angle BETA within the range of −5 degrees to +5 degrees from a plane (the surface including the plane Si illustrated in FIG. 5) orthogonal to the intersecting line (corresponding to the intersecting line LIX) between the reference plane and the c-m plane. FIG. 5 illustrates the off angle of the end face to show an advantageous effect of the method for fabricating a group-III nitride semiconductor laser device according to this embodiment.

Step Sp4: Dielectric multilayers are disposed over the end faces 5f of the laser bar 5d to produce a laser bar product. The laser bar product is then divided into group-III nitride semiconductor laser devices (each corresponding to the group-III nitride semiconductor laser device 11). In this way, group-III nitride semiconductor laser devices are produced from the laser bar 5d.

Figure 8:
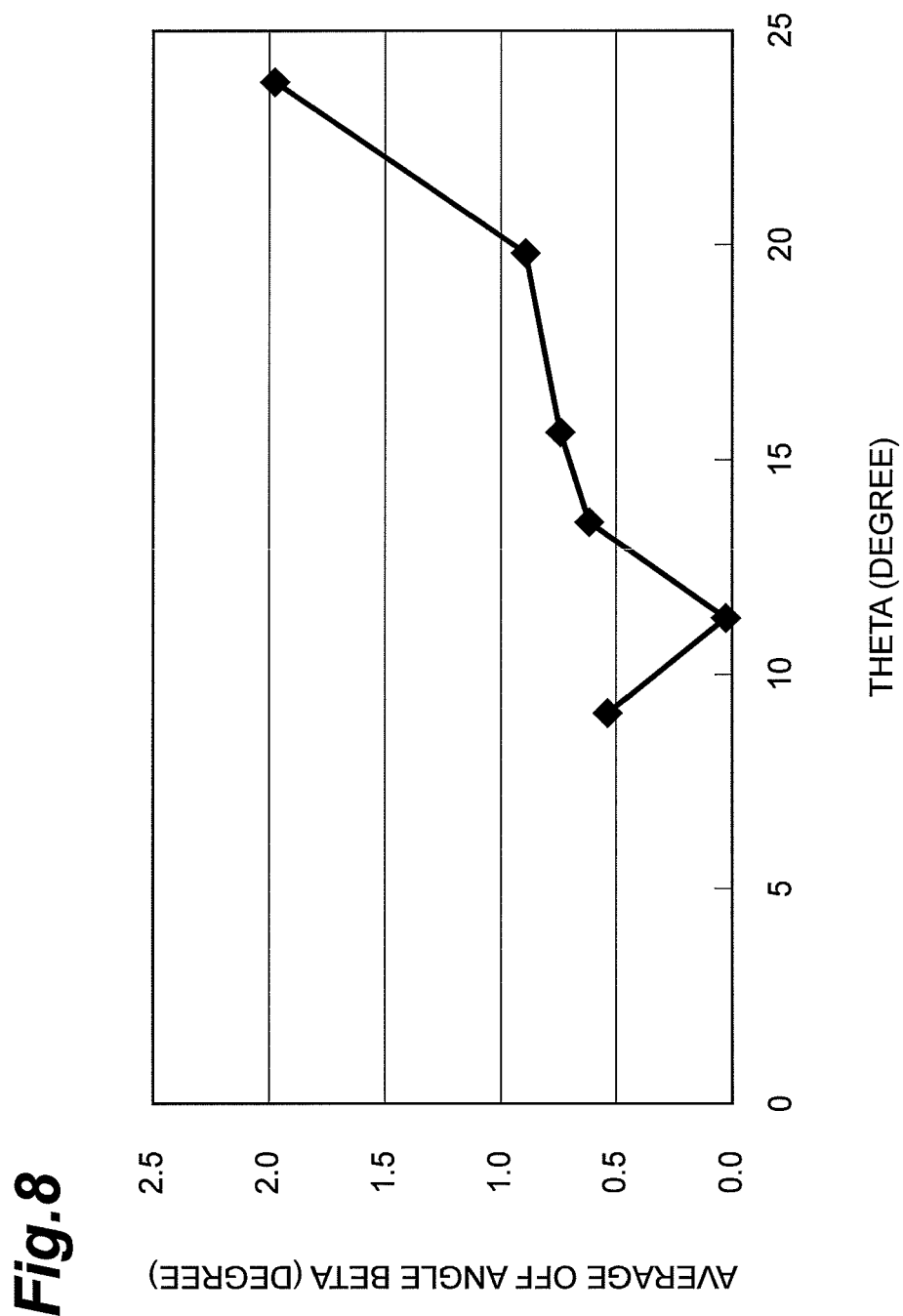
FIG. 8 illustrates the advantageous effect of the method for fabricating a group-III nitride semiconductor laser device according to an embodiment through the correlation between a deflection angle of a substrate product and the off angle of a fractured face.

Now, the deflection angle THETA will be described. FIG. 8 illustrates the relationship between the deflection angle THETA of the substrate product 5 and the average off angle BETA of laser cavity mirrors. Referring to FIG. 8, when the deflection angle THETA is approximately 11.3 degrees, the off angle BETA of the laser cavity mirror is a minimum value. The measured values plotted in the graph of FIG. 8 are as follows:

| Deflection angle THETA (degree) | Average off angle BETA (degree) |
|---|---|
| 9.1 | 0.53 |
| 11.3 | 0.03 |
| 13.5 | 0.62 |
| 15.6 | 0.75 |
| 19.8 | 0.89 |
| 23.7 | 1.98 |

The reason for the off angle BETA of the laser cavity mirror being small at a deflection angle THETA of the substrate product 5 of approximately 11.3 degrees will now be explained from crystallographic standpoint. Part (B) of FIG. 6 illustrates a state before the blade 5g is squeezed into the substrate product 5. Part (C) of FIG. 6 illustrates a state similar to that illustrated in FIG. 4 in which the blade 5g is squeezed into the substrate product 5 causing the substrate product 5 to bend. For example, if the semi-polar principal surface SF (and the front face 5a of the substrate product 5) of the substrate product 5 is the (20-21) plane and if the deflection angle THETA is 15 degrees, the axial direction vector VX of the blade 5g is parallel to the c-plane of the first region ER1. By shifting the movable member H1 toward the support member H2 and fracturing the substrate product 5 at a deflection angle THETA of 15 degrees, cleaving at the c-plane is smoothly performed, reducing the off angle BETA of the laser cavity mirror.

The deflection angle THETA is evaluated by a cantilever model K1 used in material mechanics. Part (A) of FIG. 6 illustrates the cantilever model K1. The cantilever model K1 corresponds to the substrate product 5. The cantilever model K1 enables calculation of the approximate deflection angle THETA of the substrate product 5 when the formation of the laser bar 5d starts. The cantilever model K1 protrudes perpendicularly to a sidewall K2. The cantilever model K1 is fixed to the sidewall K2 at a fixed point P3 on the sidewall K2.

A force P1 applied to a point P2 closer to an end face P4 of the cantilever model K1 moves the end face P4 of the cantilever model K1 in the direction of the force P1 and bends the cantilever model K1. The direction of the force P1 is parallel to the sidewall K2 and is orthogonal to the front face (represented by reference sign P5) of the cantilever model K1 at the fixed point P3. The end face P4 is disposed opposite to the fixed point P3.

The deflection of the cantilever model K1 is similar to the deflection of the substrate product 5 caused by the downward force of the blade 5g. Reference sign L4 represents the distance from the sidewall K2 to the point P2 (the distance between the sidewall K2 and the plane containing the point P2 and parallel to the sidewall K2), and reference sign L5 represents the distance from the point P2 to the end face P4 of the cantilever model K1 (the distance between the plane containing the point P2 and parallel to the sidewall K2 and the plane parallel to the sidewall K2 and intersecting the end face P4). The deflection angle $\theta 1$ is defined by the angle between a surface (represented by the reference sign P5) and a surface (represented by reference sign P6) of the cantilever model K1 at the fixed point P3 of the cantilever model K1 at the end face P4. The cantilever model K1 bends by the deflection angle $\theta 1$ as a result of the force P1.

The distance Y between the fixed point P3 and the point P2 viewed from the normal line of the sidewall K2 (i.e., the distance between the plane containing the fixed point P3 and orthogonal to the force P1 and the sidewall K2 and the plane containing the point P2 and orthogonal to the force P1 and the sidewall K2) is represented by the approximate expression: $Y = 2 \times (\text{distance } L4) \times (\text{deflection angle } \theta 1)/3$. According to this approximation, the calculated deflection angle $\theta 1$ is 11.3 degrees. The value of the distance L4 is, for example, 375 μm, and the value of the distance Y is, for example, 50 μm. The value of the distance L5 is, for example, 500 μm.

If the cantilever model K1 corresponds to the substrate product 5, the deflection angle THETA corresponds to the deflection angle $\theta 1$. In such a case, the deflection angle THETA is approximated to 11.3 degrees when the cantilever model K1 is used for calculation.

The calculated value 11.3 degrees of the deflection angle THETA is sufficiently close to 15 degrees in consideration of the actual experimental error and the approximation accuracy of the cantilever model K1. Thus, a high-quality laser cavity mirror is produced by optimizing the conditions in Step Sp3. The deflection angle THETA according to this embodiment is effective within the range of 11 degrees to 19 degrees in consideration of the actual experimental error and the approximation accuracy of the cantilever model K1 and FIG. 8 showing the range of the deflection angle THETA that yields an average off angle BETA of the laser cavity mirrors that is smaller than or equal to 1 degree.

As described above, the blade 5g is forced down through the first region ER1 to keep the first region ER1 squeezed into the gap (gap HL) between the support member H2 and the movable member H1 together with a part of the protective sheet TF in contact with the first region ER1 until the semi-polar principal surface SF at the end face EG1 of the first region ER1 tilts by the deflection angle THETA from the semi-polar principal surface SF of the second region ER2. In this state, the tension generated in the area of the protective sheet TF in contact with the first region ER1 increases using the movable member H1 to generate a force in the first region ER1 in a direction opposite to the direction in which the blade 5g is forced down through the first region ER1 (the direction of the axial direction vector VX). If the angle ALPHA is within the range of 71 degrees to 79 degrees, the substrate product 5 bends in the direction from the m-axis to the c-axis, and the deflection angle THETA is within the range of 11 degrees to 19 degrees, and if the angle ALPHA is within the range of 101 to 109, the substrate product 5 bends in the direction from the c-axis to the m-axis, and the deflection angle THETA is within the range of −19 degrees to −11 degrees, the blade 5g is forced down through the first region ER1 in the direction or substantially the direction along the c-plane in the first region ER1 due to the deflection of the substrate product 5. In such a state, a laser bar 5d can be readily separated from the substrate product 5 having a semi-polar principal surface SF by increasing the tension of the protective sheet TF and generating a force in the first region ER1 in a direction opposite to the direction in which the blade 5g is being forced down through the first region ER1. The face formed as a result of the separation has sufficient flatness and perpendicularity to serve as a laser cavity mirror. Thus, stable supply of laser cavity mirrors that reduce the lasing threshold current can be achieved.

Since the scribe marks 5b are formed along the a-n plane, the end faces 5f formed by the separation of the laser bar 5d by the blade 5g also extends along the a-n plane. Thus, the end faces 5f that are to be used as laser cavity mirrors can be formed as faces orthogonal to the c-m plane. Since the scribe marks 5b extend from the front face 5a to the back face 5e, the laser bar 5d can be readily separated.

The thickness DSUB of the substrate Sub in the range of 50 μm or more and 100 μm or less provides high rigidity to the substrate Sub. The surface of the substrate Sub processed by one of slicing and grinding has sufficiently high flatness.

Scribing with a laser scriber enables precise scribe marks to be formed. Since a scribe mark includes a scribe groove, the laser bar 5d can be readily separated.

The method of fabrication according to this embodiment can be applied to the substrate product 5 having a semi-polar principal surface SF tilting within a range of −4 degrees to +4 degrees from any one of {20-21} and {20-2-1} planes toward the m-plane.

Moreover, the method of fabrication according to this embodiment can be applied to the substrate product 5 having the semi-polar principal surface SF corresponding to any one of {20-21} and {20-2-1} planes.

Since the substrate Sub includes any one of GaN, AlGaN, AlN, InGaN, and InAlGaN, a nitride-based semiconductor may be used for the substrate Sub.

The end face of the active layer at the end face 5f tilts from the m-plane in the c-m plane by an angle within the range of (ALPHA−5) degrees to (ALPHA+5) degrees. Thus, the end face 5f achieves high flatness and perpendicularity required for a laser cavity mirror.

The end face (the surface including the end face SE illustrated in FIG. 5) of active layer of the substrate product 5 preferably tilts by an off angle within the range of −5 degrees to +5 degrees from a plane (the surface including the plane Si illustrated in FIG. 5) orthogonal to an intersecting line between the c-m plane and a reference plane in the reference plane orthogonal to the c-m plane and the normal axis NX. Thus, an end face (the plane including the end face SE) of the active layer can achieve high flatness and perpendicularity required for a laser cavity mirror.

The group-III nitride semiconductor laser device fabricated in Steps Sp1 to Sp4 will now be described. FIG. 7 is a schematic view of the structure of the group-III nitride semiconductor laser device 11 fabricated through the method according to this embodiment. The group-III nitride semiconductor laser device 11 has a gain-guided structure, but is not limited thereto.

The normal axis NX is the normal line of a p-side front face 13a of a laser structure 13 (the normal line of the semi-polar principal surface 17a of the support base 17) and extends in the direction of the z-axis. The semi-polar principal surface 17a of the support base 17 of the group-III nitride semiconductor laser device 11 extends parallel to the x-y plane.

FIG. 7 illustrates a typical c-plane SC. The c-axis of the hexagonal group-III nitride semiconductor of the support base 17 corresponds to the axis CX. The c-axis (axis CX) tilts by a finite angle ALPHA from the normal axis NX in the direction of the m-axis of the hexagonal group-III nitride semiconductor of the support base 17. The angle ALPHA is defined by the c-axis vector VC and the normal vector NV. The c-axis vector VC represents the direction of the c-axis. The normal vector NV extends along the normal axis NX toward the p-side front face 13a of the laser structure 13 and is orthogonal to the front face 13a and the semi-polar principal surface 17a.

The angle ALPHA can be either within the range of 71 degrees to 79 degrees or within the range of 101 degrees to 109 degrees. The angle ALPHA illustrated in FIG. 7 is within the range of 71 degrees to 79 degrees but instead may be within the range of 101 degrees to 109 degrees.

The fractured face 27 and the fractured face 29 corresponding to the end faces 5f of the laser bar 5d intersect the c-m plane. The laser cavity of the group-III nitride semiconductor laser device 11 includes the fractured faces 27 and 29, and the laser waveguide extends between the fractured face 27 and the fractured face 29. The length of the laser cavity of the group-III nitride semiconductor laser device 11 is, for example, approximately 500 μm.

The laser structure 13 has the front face 13a and the back face 13b, and the front face 13a opposites the back face 13b. The fractured face 27 and the fractured face 29 extend from the edge 13c of the front face 13a to the edge 13d of the back face 13b. The fractured faces 27 and 29 differ from conventional cleavage planes such as the c-plane, m-plane, and a-plane.

According to the group-III nitride semiconductor laser device 11, the fractured faces 27 and 29, which constitute a laser cavity, intersect the c-m plane. Thus, the laser waveguide extending in the direction of the intersecting line between the c-m plane and the semi-polar principal surface 17a can be provided. Thus, the group-III nitride semiconductor laser device 11 includes a laser cavity that has a low threshold current.

The group-III nitride semiconductor laser device 11 includes the laser structure 13, the insulating film 31, the n-side electrode 41, and the p-side electrode 15. The laser structure 13 includes the support base 17 and the semiconductor region 19. The support base 17 comprises a hexagonal group-III nitride semiconductor. The support base 17 has a semi-polar principal surface 17a and a back face 17b. The support base 17 has a thickness DSUB 50 μm or more and 100 μm or less. The support base 17 includes any one of GaN, AlGaN, AlN, InGaN, and InAlGaN. The semi-polar principal surface 17a tilts within a range of −4 degrees to +4 degrees from a semi-polar plane corresponding to any one of {20-21} and {20-2-1} planes toward the m-plane. The semi-polar principal surface 17a may correspond to any one of {20-21} and {20-2-1} planes.

The semiconductor region 19 is disposed on the semi-polar principal surface 17a of the support base 17. The semiconductor region 19 includes a semiconductor layer 20, an n-side cladding layer 21, an n-side light-guiding layer 35a, an n-side light-guiding layer 35b, an active layer 25, a p-side light-guiding layer 37, a p-side blocking layer 39, a p-side light-guiding layer 38, a cladding layer 23, and a contact layer 33.

The semiconductor layer 20 is disposed over the semi-polar principal surface 17a of the support base 17. The semiconductor layer comprises an n-type gallium nitride-based (GaN-based) semiconductor, such as n-type GaN.

The n-side cladding layer 21 is disposed over the semiconductor layer 20. The n-side cladding layer 21 comprises au n-type GaN-based semiconductor, such as n-type AlGaN and n-type InAlGaN.

The n-side light-guiding layer 35a is disposed over the n-side cladding layer 21. The n-side light-guiding layer 35b is disposed over the n-side light-guiding layer 35a. The n-side light-guiding layer 35a and the n-side light-guiding layer 35b include, for example, one of GaN and InGaN.

The active layer 25 is disposed between the n-side cladding layer 21 and the cladding layer 23. The active layer 25 is disposed specifically between the n-side light-guiding layer 35b and the p-side light-guiding layer 37. The active layer 25 includes GaN-based semiconductor layers, which are, for example, well layers 25a. The active layer 25 also includes barrier layers 25b, which comprise a GaN-based semiconductor. The well layers 25a and the barrier layers 25b are alternatively disposed. The well layers 25a comprise, for example, InGaN, and the barrier layers 25b comprise, for example, one of GaN and InGaN. The active layer 25 may include a quantum well structure that generates light having a wavelength within the range of 360 nm to 600 nm. Use of a semi-polar plane is suitable for emitting light in a wavelength of 430 nm to 550 nm.

The p-side light-guiding layer 37 is disposed over the active layer 25. The p-side light-guiding layer 37 is disposed between the active layer 25 and the p-side blocking layer 39. The p-side light-guiding layer 37 comprises an undoped GaN-based semiconductor, such as GaN and InGaN.

The p-side blocking layer 39 is disposed between the p-side light-guiding layer 37 and the p-side light-guiding layer 38. The p-side blocking layer 39 comprises a p-type GaN-based semiconductor, such as p-type AlGaN.

The p-side light-guiding layer 38 is disposed over the p-side blocking layer 39. The p-side light-guiding layer 38 is disposed between the p-side blocking layer 39 and the cladding layer 23. The p-side light-guiding layer 38 comprises a p-type GaN-based semiconductor, such as p-type GaN and p-type InGaN.

The cladding layer 23 is disposed over the p-side light-guiding layer 38. The cladding layer 23 is disposed between the p-side light-guiding layer 38 and the contact layer 33. The cladding layer 23 comprises a p-type GaN-based semiconductor, such as p-type AlGaN and p-type InAlGaN.

The contact layer 33 is disposed over the cladding layer 23. The contact layer 33 comprises a p-type GaN-based semiconductor, such as p-type GaN.

The semiconductor layer 20, the n-side cladding layer 21, the n-side light-guiding layer 35a, the n-side light-guiding layer 35b, the active layer 25, the p-side light-guiding layer 37, the p-side blocking layer 39, the p-side light-guiding layer 38, the cladding layer 23, and the contact layer 33 are arrayed in sequence along the normal axis NX of the semi-polar principal surface 17a (the p-side front face 13a of the laser structure 13).

The insulating film 31 and the p-side electrode 15 are disposed over the p-side front face 19a (the p-side front face 13a of the laser structure 13) of the semiconductor region 19. The insulating film 31 covers the front face 19a of the semiconductor region 19, and the semiconductor region 19 is disposed between the insulating film 31 and the support base 17. The insulating film 31 has an opening 31a that extends in the direction of the intersecting line LIX between the front face 19a of the semiconductor region 19 and the c-m plane, and may be arranged in a stripe pattern. The p-side electrode 15 is in contact with the front face 19a (contact layer 33) of the semiconductor region 19 through the opening 31a and extends in the direction of the intersecting line LIX. The n-side electrode 41 is provided on the n-side back face 13b (back face 17b of the support base 17) of the laser structure 13 and covers the n-side back face 13b (back face 17b).

The insulating film 31 is, for example, a SiO$_2$ insulating film. The n-side electrode 41 comprises, for example, Ti/Al/Ti/Au, and the p-side electrode 15 comprises, for example, Ni/Au. The group-III nitride semiconductor laser device 11 has a pad electrode. The pad electrode is connected to the p-side electrode 15 and comprises, for example, Ti/Al.

The laser structure 13 of the group-III nitride semiconductor laser device 11 includes the fractured face 27 and the fractured face 29, and the fractured face 27 and the fractured face 29 intersect the c-m plane. The laser waveguide of the group-III nitride semiconductor laser device 11 includes the n-side cladding layer 21, the cladding layer 23, and the active layer 25 and extends in the direction of the intersecting line LIX. The end faces SE of the active layer 25 at the fractured face 27 and the fractured face 29 (refer to FIG. 5) tilt in the c-m plane by an angle within the range of (ALPHA−5) degrees to (ALPHA+5) degrees from the m-plane orthogonal to the m-axis of the support base 17. As illustrated in FIG. 5, the end faces SE of the active layer 25 tilt by an off angle BETA within the range of −5 degrees to +5 degrees in the plane S2 (a plane defined by the reference plane of the substrate product 5) orthogonal to the c-m plane and the normal axis NX from a plane Si orthogonal to the intersecting line (intersecting line LIX) between the plane S2 and the c-m plane.

The support base 17 of the group-III nitride semiconductor laser device 11 preferably has a thickness DSUB of 400 μm or less to produce high-quality fractured faces for the laser cavity. Preferably, the thickness DSUB of the support base 17 of the group-III nitride semiconductor laser device 11 is 50 μm or more and 100 μm or less. This improves handling and enhances the production yield.

The semi-polar principal surface 17a may correspond to any one of {20-21} and {20-2-1} planes. The semi-polar principal surface 17a may be a plane slightly tilting from any one of {20-21} and {20-2-1} planes by an angle within the range of −4 degrees to +4 degrees. Such a typical semi-polar principal surface 17a can provide the fractured face 27 and the fractured face 29 that have flatness and perpendicularity sufficient for a laser cavity of the group-III nitride semiconductor laser device 11. In addition, the end faces have sufficient flatness and perpendicularity within the range of angle of typical plane orientations.

The stacking fault density of the support base 17 may be $1\times10^4$ cm$^{-3}$ or less. A stacking fault density of $1\times10_4$ cm$^{-3}$ or less can effectively prevent accidental disturbance of the flatness and/or perpendicularity of the fractured faces. The support base 17 comprises a GaN-based semiconductor including any one of GaN, AlN, AlGaN, InGaN, and InAlGaN. Such a GaN-based semiconductor provides the fractured face 27 and the fractured face 29 constituting a laser cavity. An AlN or AlGaN substrate has a large degree of polarization and a small index of refraction, and the small index of refraction enhances optical confinement. An InGaN substrate has a small lattice mismatch between the substrate and the light-emitting layer and high crystal quality.

Example

Figure 9:
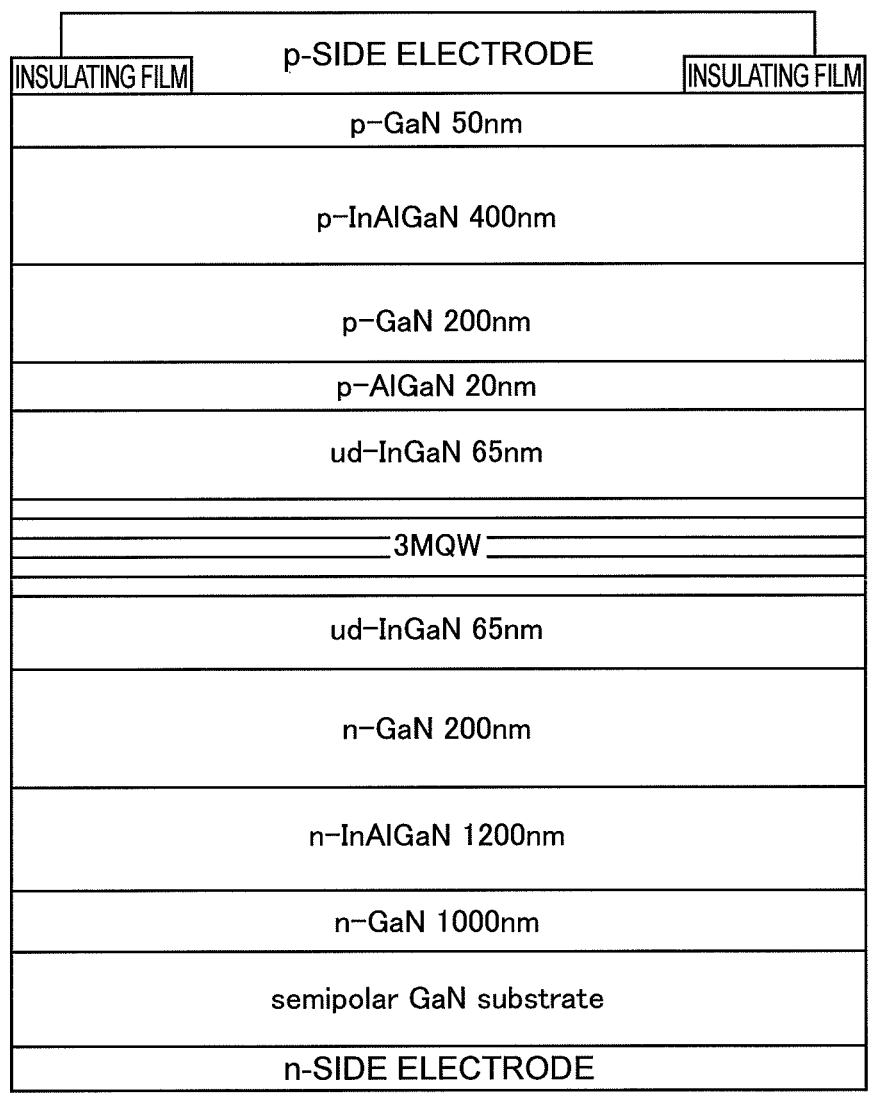
FIG. 9 illustrates the configuration of a group-III nitride semiconductor laser device according to an example.

A laser diode is fabricated through organometallic vapor phase epitaxy, as illustrated in FIG. 9. The laser diode illustrated in FIG. 9 corresponds to the group-III nitride semiconductor laser device 11 illustrated in FIG. 7. The materials used are trimethyl gallium (TMGa), trimethyl aluminum (TMAl), trimethyl indium (TMIn), ammonium (NH$_3$), and silane (SiH$_4$). The substrate is a GaN substrate (corresponding to the substrate Sub and the support base 17) having a principal surface of the (20-21) plane cutout from a thick (0001) GaN ingot that is grown by HVPE at an angle of 75 degrees toward the m-axis. The substrate is placed on a susceptor in the reactor, and an epitaxial layer (corresponding to the semiconductor region Ly and the semiconductor region 19) is grown through the following procedures.

An n-type GaN layer (corresponding to the semiconductor layer 20) is grown into a thickness of approximately 1000 nm. An n-type InAlGaN layer (corresponding to the n-side cladding layer 21) as an n-type first cladding layer is then grown into a thickness of approximately 1200 nm. After an n-type GaN layer (corresponding to the n-side light-guiding layer 35a) having a thickness of approximately 200 nm and an undoped InGaN layer (corresponding to the n-side light-guiding layer 35b) having a thickness of approximately 65 nm are grown, a three-cycle MQW (corresponding to the active layer 25) is formed by alternatively depositing GaN layers each having a thickness of approximately 15 nm and InGaN layers each having a thickness of approximately 3 nm.

Subsequently, the following layers are grown: an undoped InGaN layer (corresponding to the p-side light-guiding layer 37) having a thickness of approximately 65 nm; a p-type AlGaN layer (corresponding to the p-side blocking layer 39) having a thickness of approximately 20 nm; and a p-type GaN layer (corresponding to the p-side light-guiding layer 38) having a thickness of approximately 200 nm. Then, a p-type InAlGaN layer (corresponding to the cladding layer 23) as a p-type second cladding layer is then grown into a thickness of approximately 400 nm. Finally, a p-type GaN layer (corresponding to the contact layer 33) is grown into a thickness of approximately 50 nm.

After an $SiO_2$ insulating film (corresponding to the insulating film 31) is deposited over the p-type GaN layer into a thickness of approximately 50 nm, striped windows each having a width of approximately 10 μm are formed by photolithographic wet etching. After the striped windows are formed, a p-side electrode of Ni/Au (corresponding to the p-side electrode 15) and a pad electrode of Ti/Al are made by vapor deposition. Then, the back face (corresponding to the back face 17b) of the GaN substrate (corresponding to the substrate Sub and the support base 17) is polished with diamond slurry into a mirror-polished back face. An n-side electrode of Ti/Al/Ti/Au is deposited over the mirror-like back face (polished surface) by vapor deposition. A substrate product (corresponding to the substrate product 5) is completed in such a manner.

The laser cavity mirrors are formed with a laser scriber. A YAG laser having a wavelength of 355 nm and an output power of 100 mW is used at a scanning rate of 5 mm/s. The scribe marks (corresponding to the scribe marks 5b) are formed at a pitch of 400 μm. After the scribe marks are formed, the cleaving system according to this embodiment is used to fracture the substrate product (corresponding to the substrate product 5) to form a laser bar (corresponding to the laser bar 5d). Laser cavity mirrors are formed by such fracturing.

As described above, laser cavity mirrors having a low lasing threshold current are stably supplied through the method for fabricating a group-III nitride semiconductor laser device according to this embodiment through the use of a semi-polar plane.

The scope of the present invention has been illustrated in the embodiments with reference to the accompanying drawings. However, one skilled in the art should find that the arrangement and other details of the present invention can be changed without departing from the scope of the invention. The present invention is not limited to specific configurations described in the embodiments. Accordingly, corrections and modifications made to the claims and the spirit of the invention are included in the scope of the present invention.

What is claimed is:

1. A method for fabricating a group-III nitride semiconductor laser device, comprising the steps of:
    preparing a substrate product having a substrate and a semiconductor region, the substrate comprising a hexagonal group-III nitride semiconductor and including a semi-polar principal surface, the semiconductor region provided on the semi-polar principal surface and including an active layer;
    scribing a first surface of the substrate product to form a plurality of scribe marks extending along an a-axis of the hexagonal group-III nitride semiconductor; and
    forming a laser bar and a substrate product residue from the substrate product with a cleaving system,
    wherein, the cleaving system includes a support member supporting the substrate product, a stretchable protective sheet protecting the first surface of the substrate product facing the support member when the substrate product is supported by the support member, a blade forced down through the substrate product toward the support member from a second surface of the substrate product opposite to the first surface when the substrate product is supported by the support member, and a movable member movable relative to the support member and adjusting the tension of the protective sheet,
    the protective sheet extends in the direction of a reference axis and is disposed between the substrate product and the support member while both edges of the protective sheet intersecting the reference axis are fixed to the support member,
    the substrate product is disposed over the protective sheet and the support member such that the a-axis intersects the reference axis, the substrate product comprising a first region and a second region,
    the first region and the second region are disposed in sequence in a direction intersecting the a-axis,
    the interface of the first region and the second region extends along the a-axis,
    the first region includes a scribe mark at the furthest end among the scribe marks,
    the step of forming the laser bar and the substrate product residue includes the steps of:
        holding the substrate product with the support member such that the first region protrudes from an edge of the support member and the second region is disposed over the support member;
        putting the blade into contact with an area included in the first region of the second surface in a direction along a normal vector extending along a normal axis of the semi-polar principal surface of the substrate; and
        forcing the blade down through the first region such that the first region is squeezed between the support member and the movable member together with a part of the protective sheet in contact with the first region while increasing the tension generated in the area of the protective sheet using the movable member to generate a force in the first region in a direction opposite to the direction of travel of the blade toward the first region, until the semi-polar principal surface at an end face of the first region tilts by a deflection angle THETA from the semi-polar principal surface of the second region,
    the laser bar extends from the first surface to the second surface and has a first end surface and a second end surface formed by separation,
    the first end surface and the second end surface constitute a laser cavity of the group-III nitride semiconductor laser device,
    a c-axis vector representing the direction of a c-axis of the hexagonal group-III nitride semiconductor tilts by an angle ALPHA from a normal vector of the semi-polar principal surface of the substrate,
    an area in the first region in contact with the blade extends along the a-axis,
    the deflection angle THETA is defined in the c-m plane, the c-m plane being defined by the c-axis and an m-axis of the hexagonal group-III nitride semiconductor, the deflection angle THETA having a positive value when the substrate product bends in the direction from the m-axis to the c-axis, having a negative value when the substrate product bends in the direction from the c-axis to the m-axis, being within a range of 11 degrees to 19 degrees if the angle ALPHA is within a range of 71 degrees to 79 degrees, and being within a range of −19 degrees to −11 degrees if the angle ALPHA is within a range of 101 degrees to 109 degrees, and the first end surface and the second end surface intersect the c-m plane.

2. The method for fabricating a group-III nitride semiconductor laser device according to claim 1, wherein the scribe marks extend in a direction from the first surface to the second surface along an a-n plane defined by the a-axis and the normal axis.

3. The method for fabricating a group-III nitride semiconductor laser device according to claim 2, wherein, in the step for preparing the substrate product, the substrate is subject to a process so as to have a thickness ranging from 50 μm to 100 μm, the process is one of slicing and grinding, and the second surface is one of a processed surface formed by the process and a surface including an electrode disposed on the processed surface.

4. The method for fabricating a group-III nitride semiconductor laser device according to claim 2, wherein the scribing is conducted with a laser scriber, and the scribe marks include scribe grooves.

5. The method for fabricating a group-III nitride semiconductor laser device according to claim 2, wherein the semipolar principal surface tilts within a range of −4 degrees to +4 degrees toward an m-plane from a semi-polar plane corresponding to any one of {20-21} and {20-2-1} planes.

6. The method for fabricating a group-III nitride semiconductor laser device according to claim 2, wherein the semipolar principal surface corresponds to any one of {20-21} and {20-2-1} planes.

7. The method for fabricating a group-III nitride semiconductor laser device according to claim 1, wherein, in the step for preparing the substrate product, the substrate is subject to a process so as to have a thickness ranging from 50 μm to 100 μm, the process is one of slicing and grinding, and the second surface is one of a processed surface formed by the process and a surface including an electrode disposed on the processed surface.

8. The method for fabricating a group-III nitride semiconductor laser device according to claim 7, wherein the scribing is conducted with a laser scriber, and the scribe marks include scribe grooves.

9. The method for fabricating a group-III nitride semiconductor laser device according to claim 7, wherein the semipolar principal surface tilts within a range of −4 degrees to +4 degrees toward an m-plane from a semi-polar plane corresponding to any one of {20-21} and {20-2-1} planes.

10. The method for fabricating a group-III nitride semiconductor laser device according to claim 7, wherein the semipolar principal surface corresponds to any one of {20-21} and {20-2-1} planes.

11. The method for fabricating a group-III nitride semiconductor laser device according to claim 1, wherein the scribing is conducted with a laser scriber, and the scribe marks include scribe grooves.

12. The method for fabricating a group-III nitride semiconductor laser device according to claim 11, wherein the semipolar principal surface tilts within a range of −4 degrees to +4 degrees toward an m-plane from a semi-polar plane corresponding to any one of {20-21} and {20-2-1} planes.

13. The method for fabricating a group-III nitride semiconductor laser device according to claim 11, wherein the semipolar principal surface corresponds to any one of {20-21} and {20-2-1} planes.

14. The method for fabricating a group-III nitride semiconductor laser device according to claim 1, wherein the semipolar principal surface tilts within a range of −4 degrees to +4 degrees toward an m-plane from a semi-polar plane corresponding to any one of {20-21} and {20-2-1} planes.

15. The method for fabricating a group-III nitride semiconductor laser device according to claim 14, wherein the semipolar principal surface corresponds to any one of {20-21} and {20-2-1} planes.

16. The method for fabricating a group-III nitride semiconductor laser device according to claim 1, wherein the semipolar principal surface corresponds to any one of {20-21} and {20-2-1} planes.

17. The method for fabricating a group-III nitride semiconductor laser device according to claim 1, wherein the substrate includes any one of GaN, AlGaN, AlN, InGaN, and InAlGaN.

18. The method for fabricating a group-III nitride semiconductor laser device according to claim 1, wherein end faces of the active layer in the first end surface and the second end surface tilt by an angle within a range of (ALPHA−5) degrees to (ALPHA+5) degrees in the c-m plane from an m-plane orthogonal to the m-axis.

19. The method for fabricating a group-III nitride semiconductor laser device according to claim 18, wherein end faces of the active layer tilt by an off angle within a range of −5 degrees to +5 degrees in a reference plane orthogonal to the c-m plane and the normal axis from a plane orthogonal to an intersecting line between the c-m plane and the reference plane.

* * * * *